United States Patent [19]
Graf

[11] Patent Number: 5,869,982
[45] Date of Patent: *Feb. 9, 1999

[54] PROGRAMMABLE I/O CELL WITH DATA CONVERSION CAPABILITY

[75] Inventor: W. Alfred Graf, Saratoga, Calif.

[73] Assignee: Cypress Semiconductor Corp., San Jose, Calif.

[*] Notice: The term of this patent shall not extend beyond the expiration date of Pat. No. 5,811,989.

[21] Appl. No.: 580,770

[22] Filed: Dec. 29, 1995

[51] Int. Cl.⁶ ................................................. H03K 19/177
[52] U.S. Cl. ................................................ 326/40; 326/46
[58] Field of Search ............................ 326/39–41, 46–47; 365/219

[56] References Cited

U.S. PATENT DOCUMENTS

| | | | |
|---|---|---|---|
| 4,758,746 | 7/1988 | Birkner et al. | 326/38 |
| 4,942,318 | 7/1990 | Kawana | 326/37 |
| 4,963,770 | 10/1990 | Keida | 326/40 |
| 5,023,484 | 6/1991 | Pathak et al. | 326/40 |
| 5,027,011 | 6/1991 | Steele | 326/40 |
| 5,220,213 | 6/1993 | Chan et al. | 326/40 |
| 5,282,164 | 1/1994 | Kawana | 326/39 |
| 5,329,460 | 7/1994 | Agrawal et al. | 326/39 |

*Primary Examiner*—Jon Santamauro
*Attorney, Agent, or Firm*—Blakely, Sokoloff Taylor & Zafman LLP

[57] ABSTRACT

A programmable I/O cell with a multiplicity of configurations and data conversion options implemented through the use of antifuses. Increased logic utilization and reduced number of components necessary to implement such designs by using the registers in the I/O cell to implement data conversion functions thereby saving the logic and registers of the FPGA logic cells for implementation of other functions is achieved. Serial-to-parallel and parallel-to-serial data conversion operations utilize adjacent registers in adjacent cells to perform shift operations.

25 Claims, 4 Drawing Sheets

FIG. 4

I/O Cell — Configuration Options

| Input Function → / Output Function ↓ | Direct Input | Registered Input | Input Stage of Input Shift Register | Buried Stage of Input Shift Register | Buried Input Register |
|---|---|---|---|---|---|
| Direct Output | Config B'1<br>BIDIR<br>57 | Config B'2<br>BIDIR<br>54, 57, 62 | Config B'3<br>BIDIR<br>54, 61, 57 | Config B'4<br>XI<br>50 or 51, 53<br>60, 61, 57 | Config B'5<br>XI<br>53, 62<br>60, 57 |
| Registered Output | Config B'6<br>BIDIR<br>58, 64, 66 | Config B'7<br>BIDIR<br>54, 62, 58, 64, 66 | Config B'8<br>BIDIR<br>54, 61, 58, 64, 66 | Config B'9<br>XI<br>50 or 51, 53<br>60, 61, 58, 64, 66 | Config B'10<br>XI<br>53, 60, 62,<br>58, 64, 66 |
| Output Stage of Output Shift Register | Config B'11<br>BIDIR<br>67 or 68, 58<br>64, 65 | Config B'12<br>BIDIR<br>54, 62, 58, 64, 65 | Config B'13<br>BIDIR<br>67, 58, 64, 65 | Config B'14<br>XI<br>50 or 51,<br>67 or 68, 53,<br>60, 61, 58, 64, 65 | Config B'15<br>XI<br>67 or 68,<br>53, 60, 62,<br>58, 64, 65 |
| Buried Stage of Output Shift Register | Config B'16<br>XO<br>67 or 68,<br>59, 56, 64, 65 | Config B'17<br>BIDIR<br>67 or 68<br>54, 62, 59, 64, 65 | Config B'18<br>XO<br>67 or 68<br>54, 61, 59, 64, 65 | Config B'19<br>DX<br>50 or 51, 67 or 68,<br>56 or 57 & 60,<br>53, 64, 65, 61, 59 | Config B'20<br>DX<br>67 or 68, 59<br>56 or 57 & 60,<br>53, 62, 64, 65 |
| Buried Output Register | Config B'21<br>XO<br>59, 56,<br>64, 66, 69 | Config B'22<br>XO<br>54, 62<br>59, 64, 66, 69 | Config B'23<br>XO<br>54, 61<br>59, 64, 66, 69 | Config B'24<br>DX<br>50 or 51, 53,<br>56 or 57 & 60,<br>61, 64, 66, 69, 59 | Config B'25<br>DX<br>56 or 57 & 60,<br>53, 62, 64,<br>66, 69, 59 |

PROGRAMMABLE I/O CELL WITH DATA CONVERSION CAPABILITY

CROSS-REFERENCE TO RELATED APPLICATIONS

This Application is related to the following Applications for United States Letters Patent, each of which are assigned to the Assignee of the present invention:
1. Application Ser. No. 08/581,105, filed Dec. 29, 1995 entitled, "Programmable I/O Cell With Data Conversion Capability".
2. Application Ser. No. 08/589,855, filed Dec. 29, 1995 entitled, "Programmable I/O Cell With Data Conversion Capability".
3. Application Ser. No. 08/578,201, filed Dec. 29, 1995 entitled, "Programmable I/O Cell With Data Conversion Capability".
4. Application Ser. No. 08/580,836, filed Dec. 29, 1995 entitled, "Programmable I/O Cell With Data Conversion Capability".

BACKGROUND

1. Field of the Invention

The area of the present invention relates generally to programmable logic devices and, more particularly, to programmable logic devices having a data conversion capability.

2. Background Art

In data communication and telecommunication applications the need to convert data from parallel data words to a serial data stream or from a serial data stream to parallel data is a frequent requirement. In CPLDs and FPGAs used in these applications this conversion is accomplished by use of logic block or logic cell register resources. When FPGA logic cell registers, or CPLD macrocell registers, are used strictly as shift register stages, the logic associated with the registers so employed is typically wasted.

Occasionally, a small amount of RAM (a few bytes) is needed in a design implemented in an FPGA or CPLD. In other than Look-Up-Table RAM based FPGAs, precious logic cell registers or CPLD macrocell registers may be used to implement this RAM. Typically, the logic resources associated with these registers is, again, wasted, The result of using the registers of FPGA logic cells or CPLD macrocells to create the structures required to perform serial-to-parallel and parallel-to-serial data conversion is inefficient use of the limited register resources. This very low logic efficiency means that a greater number of components is required and greater board area than would otherwise be necessary is used.

SUMMARY OF THE INVENTION

According to one embodiment of the present invention, by providing minimal additional circuitry and programmable elements to the I/O cells of a programmable logic device, many serial-to-parallel and parallel-to-serial data conversion operations typically required in data communication and telecommunication applications can take place in the I/O cells, leaving the bulk of internal resources available to implement other logic functions. The features of the I/O cell allow for a multiplicity of configurations and data conversion options which would otherwise require use of additional registers in the logic cells of prior FPGA architectures.

In one configuration, a preferred embodiment of the present invention allows for the conversion of a serial input data stream to a parallel data word. A first bit of the serial data stream is registered in a first register of a first input/output cell of a programmable logic device. The first bit is transmitted to and registered in a second register in a second input/output cell of the device while a second bit of the serial data stream is registered in the first register. The first bit and the second bit are transmitted out of the second register and the first register, respectively, in parallel into a programmable interconnect matrix such that the first bit and the second bit comprise a parallel data word.

In a second configuration, a preferred embodiment of the present invention allows for converting a serial output data stream to a parallel output data word. A first bit of the serial output data stream is registered in a first register of a first input/output cell of a programmable logic device. The first bit is transmitted to and registered in a second register in a second input/output cell of the device while a second bit of the serial output data stream is registered in the first register. The first bit and the second bit are transmitted from the second register and the first register, respectively, in parallel to two output pins of the device, such that the first bit and the second bit comprise a parallel data word at the two output pins.

Additional configurations of a preferred embodiment allow other data conversion schemes which find applications in data communications, telecommunications and other fields.

BRIEF DESCRIPTION OF THE DRAWINGS

The present invention is illustrated by way of example and not limitation in the figures of the accompanying drawings in which:

FIG. 4 shows a table of configurations for one embodiment of the programmable I/O cell of the present invention.

DETAILED DESCRIPTION

Figure 1:
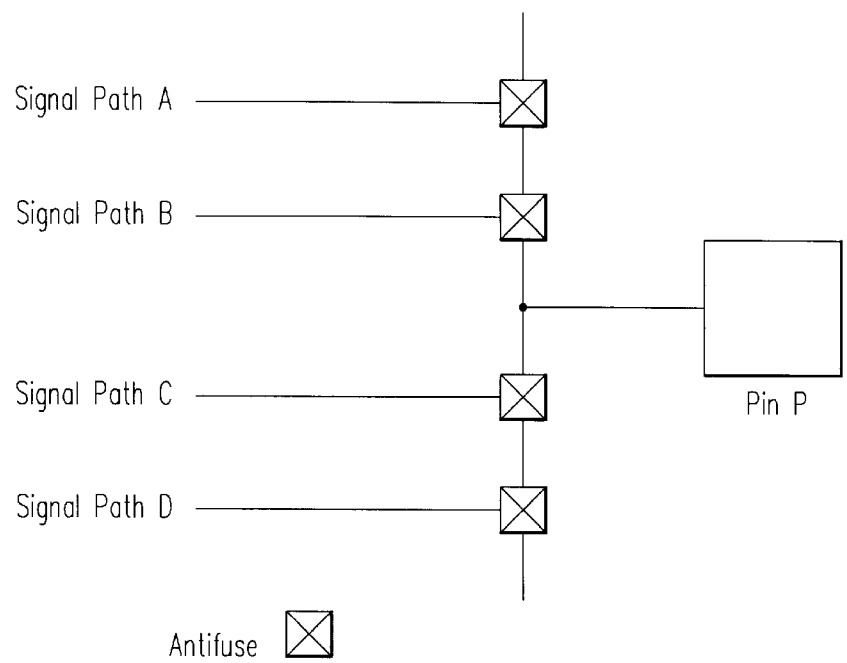
FIG. 1 illustrates antifuse programmed selection of one of four possible data paths.

Referring to the drawings in detail, the following description sets forth numerous specific details in order to provide a thorough understanding of the present invention. However, after reviewing this specification, it will be apparent to those skilled in the art that the present invention may be practiced without these specific details. In other instances, well known structures, techniques and devices have not been described in detail in order to not unnecessarily obscure the present invention.

An I/O cell for an antifuse based FPGA is described. Antifuses are very small, low capacitance programmable elements which are "open" or non-conducting in the virgin (unprogrammed) state but can be programmed by the passage of electric current to form a very low resistance, low capacitance connection. These antifuses can be very useful in the configuration of signal path options in the in the logic blocks and I/O blocks of FPGAs and CPLDs. Although the present description is provided with reference to antifuses, upon review of the specification others skilled in the art will realize that similar implementations could be made using other programmable devices such as EEPROMs and the like. It will be appreciated that the use of such devices is within the scope of the present invention.

Figure 2:
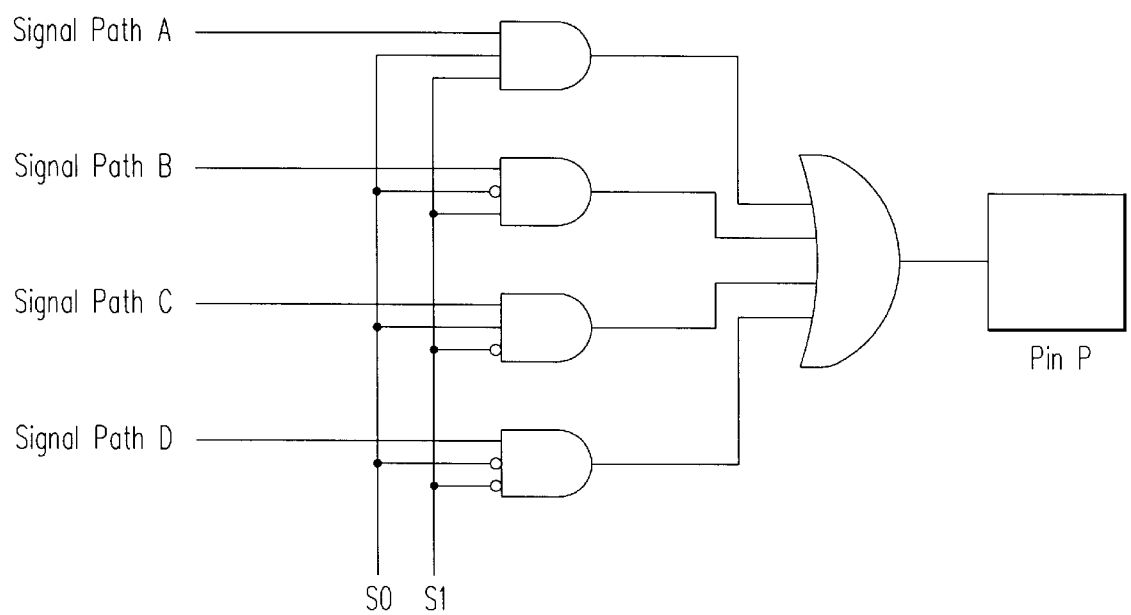
FIG. 2 illustrates multiplexer-based selection of one of four possible data paths.

FIG. 1 shows antifuse-based programmed selection of one of four possible signal paths, one of which may be selected by programming of the appropriate antifuse to be coupled to pin P. The same options selectable by a multiplexer, as is common in RAM-based FPGAs and non-volatile EEPROM and EPROM based CPLDs, is shown in FIG. 2. The multiplexer selection scheme is more complex and is slower than the simpler antifuse selection scheme of FIG. 1. Of course, the design software making the selection of the signal source in the antifuse scheme of FIG. 1 must exclude the possibility that two antifuses would be programmed in any given configuration, as this would result in signal contention.

The further benefit of the antifuse scheme of FIG. 1 is that many signal selection options can be offered with little increase in signal delay because for each new option only the capacitive loading (typically less than 1 pF per antifuse) of the additional unprogrammed antifuse affects the signal delay for the signal path for which the antifuse is programmed.

Because of the small size of the antifuse element relative to the transistors necessary to implement a multiplexer, the selection structure can be implemented in a much smaller silicon area. As the number of signal sources increases, the savings relative to a multiplexer implementation increases.

The ability of antifuses to implement, efficiently and with minimal signal delay, many signal path selection options in a programmable logic block or an I/O block of an FPGA or CPLD means that a greater number of configuration options can be implemented with minimal increase in signal delay and in less silicon area than that required for multiplexer based selection means.

A Flexible Antifuse Based FPGA Input/Output (I/O) Cell

As discussed above, in data communication and telecommunication applications the need to convert data from parallel data words to a serial data stream or from a serial data stream to parallel data is a frequent requirement. This conversion requires many FPGA logic cell registers to be used strictly as shift register stages and usually wastes the logic of the logic cell whose registers are so employed. The following describes an antifuse configured FPGA I/O cell 10 which, in addition to performing conventional I/O, can also implement parallel-to-serial and serial-to-parallel data conversion on-the-fly, as is frequently required in datacom and telecom applications. This approach frees up the registers in the logic cells and avoids wasting of the logic in the logic cells as often results when these conversion functions are implemented in existing FPGAs.

Figure 3:
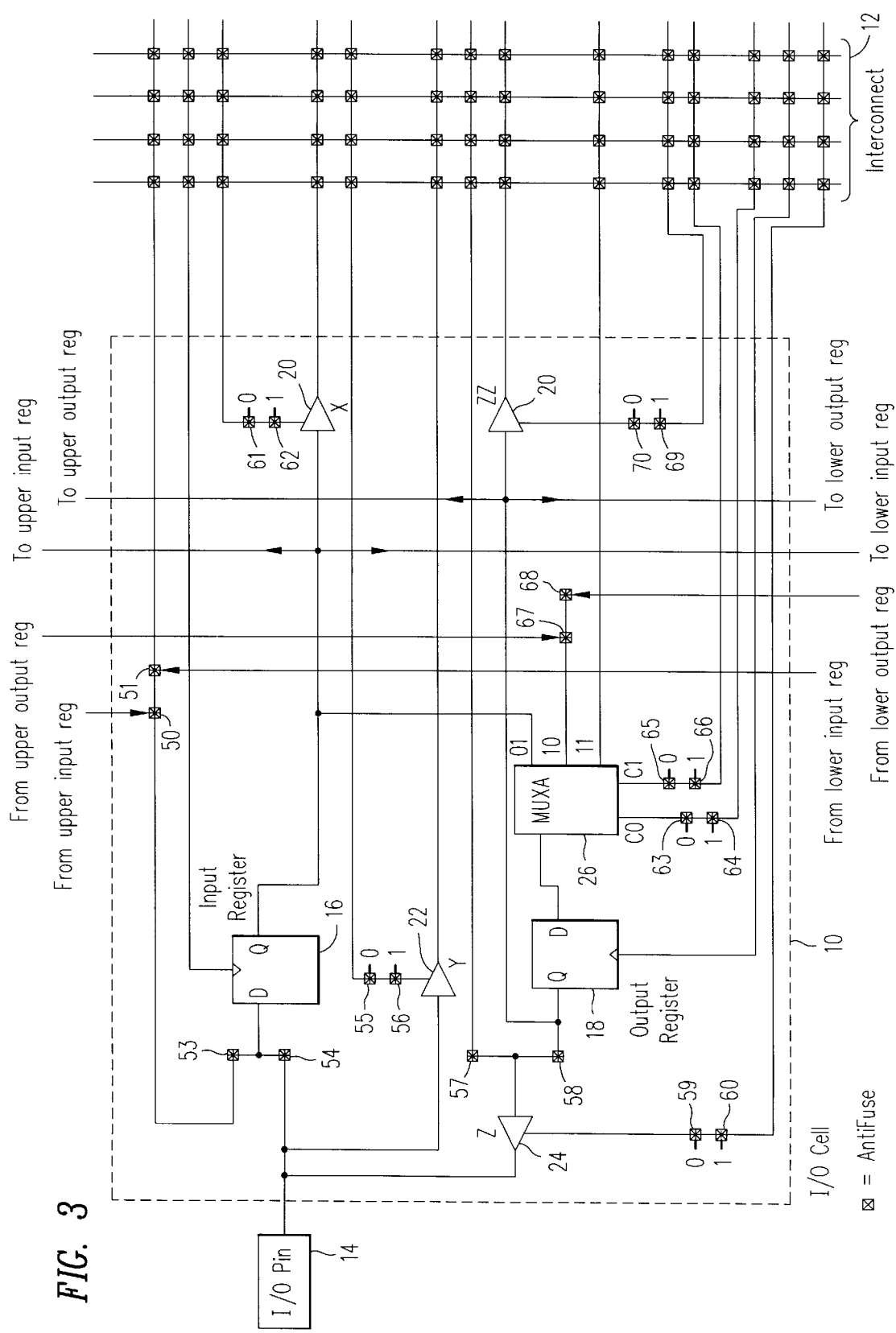
FIG. 3 shows one embodiment of the programmable I/O cell of the present invention.

The FPGA I/O cell 10 is shown in FIG. 3. Several of the novel configurations possible with this I/O cell are described below with the listing of the programmed antifuses necessary to implement the configuration. Those skilled in the art will, upon review of the details of this specification, recognize that other configurations can be achieved and implemented for other applications. The following configurations are therefore presented by way of example and not limitation.

The FPGA I/O cell 10 contains two registers, an input register 16 and an output register 18. FIG. 4 illustrates several of the novel configurations possible with this I/O cell 10 through simultaneous use of the two I/O registers. Each cell in the table of FIG. 4 specifies the programmed antifuses necessary to implement the configuration. In addition, each cell in table of FIG. 4 indicates a configuration type as BIDIR, XO, XI or DX to indicate possible restrictions on the configuration or the class of possible additional configurations which can be variations on the configuration described in the cell. The classes of configurations used are:

BIDIR—This configuration is only possible as a bidirectional configuration in which either the input path or the output path is enabled via logic control of buffers Y 22 and Z 24 respectively. Buffers Y 22 and Z 24 cannot be enabled simultaneously to function as both input path and output path, as contention will result.

XO—This configuration can also simultaneously accommodate a direct output in a bidirectional mode such that buffers Y 22 and Z 24 are used to prevent contention by enabling the input path and the output path respectively at different, mutually exclusive times.

XI—This configuration can also simultaneously accommodate a direct input in a bidirectional mode such that buffers Y 22 and Z 24 are used to prevent contention by enabling the input path and the output path respectively at different, mutually exclusive times.

DX—This configuration can also simultaneously accommodate a direct input or a direct output. In addition, this configuration can also simultaneously accommodate both a direct input and a direct output in a bidirectional mode such that buffers Y 22 and Z 24 are used to prevent contention by enabling the input path and the output path respectively at different, mutually exclusive times.

Three state buffer X 20 in FIG. 3 isolates the output of the input register 16 from internal interconnect 12 when serial data is shifted into a serial shift register composed of multiple of I/O cell 10 input registers 16 for parallel transfer to the internal interconnect 12. Three state buffer Y 22 is provided to isolate the input path interconnect from the I/O pin 14 when pin 14 is being driven as an output in a bidirectional operating mode. The input register 16 can also be configured as a buried register or as an input stage or buried, intermediate stage of a serial input shift register composed of adjacent I/O cell 10 input registers 16. The output register 18 can also be configured as a buried register or as an output stage or buried, intermediate stage of a serial output shift register composed of multiple adjacent I/O cell 10 output registers 18. The input register 16 and the output register 18 of the same I/O cell 10 can be used simultaneously as the input stage, intermediate stage or final stage of two independent internal shift registers, one composed of adjacent I/O cell 10 input registers 16 and the other of I/O cell 10 output registers 18 respectively.

The buffer ZZ 30 in I/O cell 10 isolates the interconnect 12 from the output register 18 when data is being shifted in a serial shift register composed of multiple I/O cell 10 output registers 18. The availability of this buffer ZZ 30 allows internal serial-to-parallel data conversion in a serial shift register implemented in multiple I/O cell 10 output registers 18.

I/O cell 10 also allows the input register 16 and the output register 18 of the same I/O cell 10 to be combined in the same shift register by use of general interconnect 12. In such a shift register, the output of the input register 16 is routed through the interconnect 12 to the input of the output register 18. I/O cell 10 further contains programmable paths to allow direct connection of adjacent input registers 16 as a shift register via antifuse links 50 and 51 and direct connection of adjacent output registers 18 as a shift register via antifuse links 67 and 68.

A shift register may be built of mixed segments of input registers 16 and output registers 18 and allow assembly of physically separated segments of the shift register by use of the general internal interconnect 12. Internal interconnect 12 is shown in FIG. 3 with only four columns. Those skilled in the art will recognize that this is for convenience only and that interconnect 12 may comprise any number of rows and columns necessary to implement a desired configuration. Configurations B'5, B'10, B'15, B'20 and B'21 through B'25

One or both of the I/O cell 10 registers can be used as a buried register when they are not required for I/O when the cells 10 function as a direct input or a direct output. For configurations B'5, B'10 and B'15, the cell 10 can also accommodate an additional direct input in a bidirectional mode of operation (class XI in FIG. 4) since the direct input path is still available even though the input register 16 is used as a buried register. Logic control of buffers Y 22 and Z 24 via connection of the respective buffer control lines to interconnect 12 allows bidirectional operation.

For configurations B'21, B'22 and B'23, the cell 10 can also accommodate an additional direct output in a bidirectional mode of operation (class XO in FIG. 4) since the direct output path is still available even though the output register 18 is used as a buried register. Logic control of buffers Y 22 and Z 24 via connection of the respective buffer control lines to interconnect 12 allows this bidirectional operation.

Configurations B'20, B'24 and B'25 can implement a dedicated direct input by programming antifuse 56 or a dedicated direct output by programming antifuses 57 and 60 since both direct paths are still available. These same three configurations can implement both direct input and direct output in a bidirectional mode by programming antifuse 57 and leaving antifuses 35, 56, 59, and 60 unprogrammed to allow bidirectional I/O via logic control of buffers Y 22 and Z 24 by connecting the respective buffer control lines to interconnect 12.

A summary of the antifuses programmed for the above configurations and the resulting data path operations follows:

For Configuration B'5, antifuses 53, 57, 60, and 62 are programmed. Data can be stored in register 16 by transmitting the data from interconnect 12 to the input of register 16. The data is registered in register 16 and then transmitted out of register 16 and through buffer X 20 back into interconnect 12. In this fashion, register 16 operates as a buried register. At the same time, data can be transmitted from interconnect 12, through buffer Z 24 directly to the I/O pin 14.

For Configuration B'10, antifuses 53, 58, 60, 62, 64, and 66 are programmed. Data can be stored in register 16 as for configuration B'5. Register output data is transmitted from interconnect 12 through the "11" data path of MUX A 26 to register 18. The data is first registered in register 18 and then transmitted out of register 18, through buffer Z 24 to I/O pin 14.

Configuration B'15 has antifuses 53, 58, 60, 62, 64, 65, and 67 or 68 programmed. Buried register operation of register 16 is as for configuration B'5. Register 18 operates as the output stage of a serial shift output register comprised of multiple I/O cells 10. Data is received from an adjacent cell 10 via the "10" data path of MUX A 26 and registered in register 18. The data is then transmitted out of register 18 through buffer Z 24 to I/O pin 14.

Configuration B'20 has antifuses 53, 56 or 57 and 60, 62, 64, 65, and 67 or 68 programmed. Buried register operation of register 16 is as for configuration B'5. Register 18 operates as a buried, intermediate register stage in a serial output shift register. Data is received from an adjacent cell 10 via the "10" data path of MUX A 26 and registered in register 18. The data is transmitted out of register 18 and routed to an adjacent cell 10. Further, I/O cell 10 can be configured for direct input (antifuse 56 programmed), in which case data is received on I/O pin 14 and transmitted to interconnect 12 via buffer Y 22. Alternatively, cell 10 can be configured for direct output (antifuses 57 and 60 programmed) in which case data from interconnect 12 is transmitted through buffer Z 24 to I/O pin 14.

Configuration B'20 can also implement bidirectional input/direct output by leaving antifuses 55, 56, 59, and 60 unprogrammed and connecting the respective buffer control lines to interconnect 12 to implement logic control of buffers Y 22 and Z 24.

For Configuration B'21, antifuses 56, 59, 64, 66, and 69 are programmed. In this configuration, register 18 operates as a buried register. Data is transmitted from interconnect 12 via the "11" data path of MUX A 26 and registered in register 18. The data is then transmitted out of register 18 and back to interconnect 12. In this configuration, I/O cell 10 also operates as a direct input with data being received on I/O pin 14 and transmitted through buffer Y 22 to interconnect 12.

Configuration B'22 requires antifuses 54, 59, 62, 64, 66, and 69 programmed. Buried register 18 operates as for configuration B'21. I/O cell 10 also accommodates registered input with data from I/O pin 14 being registered in register 16. This data is then transmitted out through buffer X 20 to interconnect 12.

For Configuration B'23, antifuses 54, 59, 61, 64, 66, and 69 are programmed. In this configuration, register 18 operates as a buried register as for configuration B'21. I/O cell 10 again accommodates registered input as for Configuration B'22, however, the data is now transmitted out of register 16 to an adjacent cell 10. In this fashion, register 16 operates as the first stage of an input serial shift register.

Configuration B'24 allows register 16 to be used as a buried, intermediate stage of a serial shift register while register 18 is used as a buried register. Antifuses 50 or 51, 53, 56 or 57 and 60, 61, 64, 66, and 69 are programmed. Register 16 receives data from an adjacent cell 10. Data is first registered in register 16 and then transmitted out to another adjacent cell 10. Register 18 operates as for Configuration B'21, with data being received from interconnect 12, via data path "11" of MUX A 26 and being registered in register 18. The data is then transmitted out to interconnect 12. If antifuse 56 is programmed, the I/O cell 10 also operates for direct input with data received on I/O pin 14 being transmitted through buffer Y 22 to interconnect 12. Alternatively, if antifuses 57 and 60 are programmed, I/O cell 10 operates for direct output with data from interconnect 12 being transmitted via buffer Z 24 to I/O pin 14. Configuration B'24 can also implement bidirectional input/direct output by leaving antifuses 55, 56, 59, and 60 unprogrammed and connecting the respective buffer control lines to interconnect 12 to implement logic control of buffers Y 22 and Z 24.

For Configuration B'25, antifuses 53, 56 or 57 and 60, 62, 64, 66, and 69 are programmed. Register 16 operates as a buried register as for Configuration B'5. Register 18 operates as for configuration B'21, receiving data via the "11" data path of MUX A 26. The I/O cell 10 provides for direct input if antifuse 56 is programmed, with data received at I/O pin 14 Being transmitted via buffer Y 22 to interconnect 12. Alternatively, if antifuses 57 and 60 are programmed, I/O cell 10 operates for direct output with data from interconnect 12 being transmitted via buffer Z 24 to I/O pin 14. Configuration B'25 can also implement bidirectional input/direct output by leaving antifuses 55, 56, 59, and 60 unprogrammed and connecting the respective buffer control lines to interconnect 12 to implement logic control of buffers Y 22 and Z 24.

Configurations B'4, B'9 B'14, and B'16 through B'19

One of both of the registers in I/O cell 10 can be used as a buried, intermediate stage of a serial shift register when not required for I/O when the cell 10 functions as a direct input or a direct output. For example, when the I/O cell 10 input path is dedicated to direct or registered input (Configurations B'16, B'17, and B'18), the output register 18 may be used as buried, intermediate stage of a serial, output shift register when linked with other output registers 18 in adjacent I/O cells 10.

When the I/O cell 10 output path is dedicated to direct or registered output (configurations B'4, B'9 and B'14), the input register 16 may be used as a buried, intermediate stage in an serial shift register when linked with other input registers 16 in adjacent I/O cells 10.

Implementation of a serial shift register with unused input registers 16 in Configurations B'4, B'9, B'14, B'19 and B'24 requires the stages to be implemented sequentially in adjacent I/O cells 10 to take advantage of the programmable direct link between adjacent input registers 16 via antifuses 50 and 51 in FIG. 3. It will be appreciated that for configurations B'4, B'9, and B'14, the I/O cell 10 can also accommodate an additional direct input in a bidirectional mode of operation since the direct input path is still available even though the input register 16 is used as a buried, intermediate stage of a serial input register. The bidirectional mode of I/O operation is implemented by logic control of buffers Y 22 and Z 24, via connection of the respective buffer control lines to internal interconnect 12, to enable the input path or the output path respectively at mutually exclusive times to avoid contention on the I/O pin 14.

Figure 5:
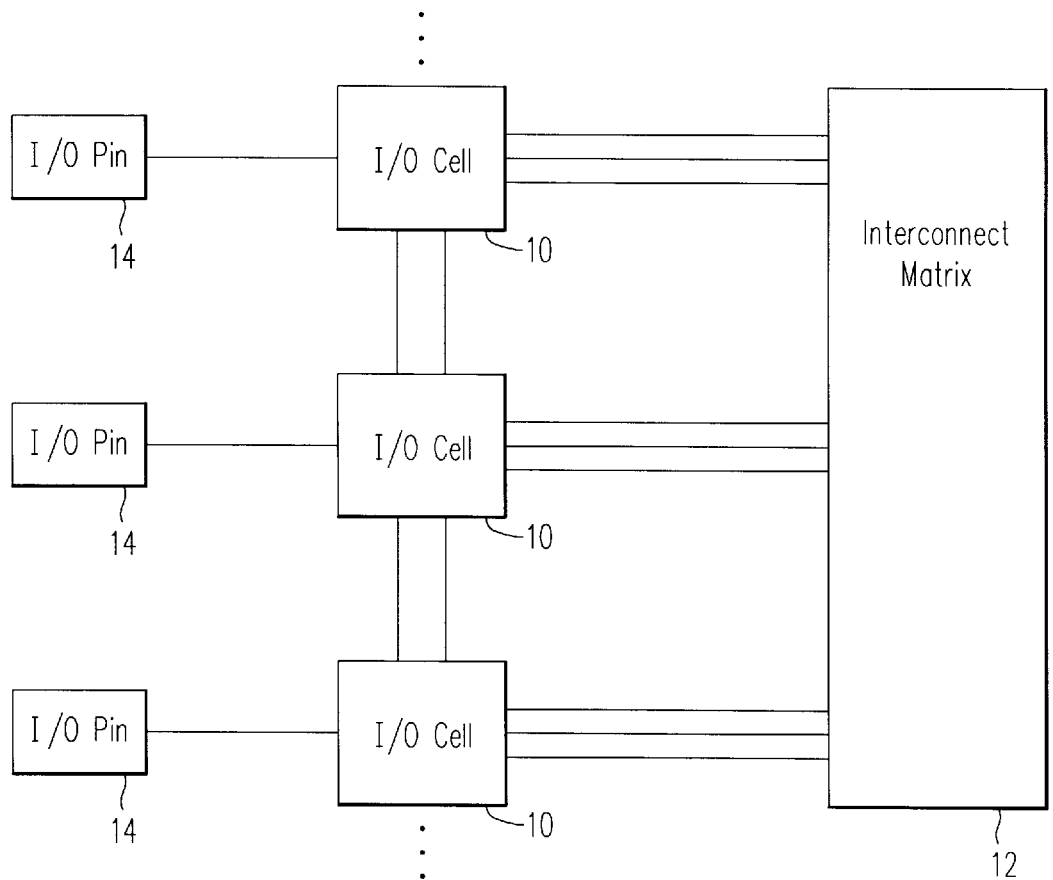
FIG. 5 shows an embodiment of a Programmable Logic Device according to the present invention.

FIG. 5 illustrates an embodiment of a PLD according to the present invention in which adjacent I/O cells 10 are connected. Each I/O cell 10 is further connected to an I/O pin 14 as well as the programmable interconnect matrix 12.

Implementation of a serial shift register with unused output registers 18 in Configurations B'16 through B'20 requires the stages to be implemented sequentially in adjacent I/O cells 10 to take advantage of the programmable direct serial connection between adjacent output registers 18 afforded by antifuses 67 and 68 in FIG. 3. Notice that for Configurations B'16, B'17, and B'18 the I/O cell 10 can also accommodate an additional direct output in a bidirectional mode of operation since the direct input path is still available even though the output register 18 is used as a buried, intermediate stage of an output serial shift register. The bidirectional mode of I/O operation is implemented by logic control of buffers Y 22 and Z 24, via connection of the respective buffer control lines to internal interconnect 12, to enable the input path or the output path, respectively, at mutually exclusive times to avoid contention on the I/O pin 14.

The shift register can be composed of shift register segments implemented in contiguous, adjacent I/O cells 10 but whose segments are located in physically separated portions of the chip containing the I/O cells. The output of all segments but the final one can be linked through general interconnect 12 to the input of the subsequent segment to create a longer shift string even though the segments are not located in contiguous I/O cells 10. The output of the last stage of all segments except the last segment would be routed through the general interconnect 12 to the MUX A 26 "11" input path of the first stage of the next segment for a shift register implemented in adjacent I/O cell 10 output registers 18 or to the antifuse 53 path of the input register 16 for a shift register implemented in adjacent I/O cell 10 input registers 16.

In addition, configurations B'19, B'20, B'24 and B'25 can accommodate a dedicated direct input or a dedicated direct output since both direct paths are still available. The same configurations (B'19, B'20, B'24 and B'25) can, of course, also implement a direct input and a direct output in a bidirectional mode of operation using buffers Y 22 and Z 24 of FIG. 3 under logic control, via connection of the respective buffer control lines to internal interconnect 12, to enable the input path or the output path respectively at mutually exclusive times to avoid contention on the I/O pin 14.

Following is a summary of the above configurations with a listing of the antifuse programming required to implement each configuration.

Configuration B'4 has antifuses 50 or 51, 53, 57, 60 and 61 programmed. This configuration allows register 16 to be used as a buried, intermediate stage of a serial shift register. Data is received from an adjacent cell 10 and transmitted out to another adjacent cell 10. I/O cell 10 also operates for direct output with data from interconnect 12 being transmitted via buffer Z 24 to I/O pin 14.

Configuration B'9 has antifuses 50 or 51, 53, 58, 60, 61, 64 and 66 programmed. Register 16 operates as a buried, intermediate stage of a serial shift register as for Configuration B'4. The I/O cell 10 operates for registered output with data from interconnect 12 being transmitted via data path "11" of MUX A 26 to register 18. The data is first registered in register 16 and then transmitted out of register 18 through buffer Z 24 to I/O pin 14.

For Configuration B'14, antifuses 50 or 51, 53, 58, 60, 61, 64, 65, and 67 or 68 are programmed. Register 16 operates as a buried, intermediate stage of a serial shift register as for Configuration B'4. Register 18 operates as the output stage of a serial output shift register. Data is received from an adjacent cell 10 via the "10" data path of MUX A 26 and registered in register 18. The data is then transmitted out of register 18 and transmitted through buffer Z 24 to I/O pin 14.

Configuration B'16 allows register 18 to Be used as a buried, intermediate stage of a serial shift register while I/O cell 10 is configured for direct input. Antifuses 56, 59, 64, 65, and 67 or 68 are programmed. Register 18 receives data from an adjacent cell 10 via the "10" path of MUX A 26. The data is first registered in register 18 and then transmitted out to interconnect 12. Direct input of data from I/O pin 14 is through buffer Y 22 to interconnect 12.

Configuration B'17 has antifuses 54, 59, 62, 64, 65, and 67 or 68 programmed. Register 18 operates as a buried, intermediate stage of a serial shift register as for Configuration B'16. The I/O cell 10 receives data from I/O pin 14, which is registered in register 16. This data is transmitted out through buffer X 20 into interconnect 12.

For Configuration B'18, antifuses 54, 59, 61, 64, 65, and 67 or 68 are programmed. Operation in this configuration is as for Configuration B'17 except that the registered input data is transmitted out of register 16 to an adjacent cell, rather than to interconnect 12. In this way, register 16 operates as the input stage of a serial input shift register.

Configuration B'19 has antifuses 50 or 51, 53, 56 or 57 and 60, 61, 64, 65, 67 or 68, and 69 programmed. This configuration allows register 16 to operate as a buried, intermediate stage of a serial input shift register, with data being received from an adjacent cell 10. The data is transmitted out of register 16 to another adjacent cell 10. In addition, register 18 operates as a buried, intermediate stage of a serial shift register as for Configuration B'17. If antifuse 56 is programmed, the I/O cell 10 receives direct input data from I/O pin 14. The data is transmitted through buffer Y 22 to interconnect 12. Alternatively, if antifuses 57 and 60 are programmed, direct output of data from interconnect 12, through buffer Z 24, to I/O pin 14 is achieved.

Configurations B'3, B'8 and B'13

I/O Cell 10 of FIG. 3 can also implement an external serial input stage for a shift register implemented in input registers 16 in Configurations B'3, B'8, B'13, B'18, and B'23. This can be accomplished while still using the output register 18 as a buried register (Configuration B'23) or as a buried, intermediate stage of a serial shift register implemented in adjacent output registers 18 (Configuration B'18). The other configurations (B'3, B'8, and B'13) can accommodate output path functions which need access to the I/O pin 14 only in a bidirectional mode of operation using buffers Y 22 and Z 24 under logic control, via connection of the respective buffer control lines to internal interconnect 12, to select the input path or the output path, respectively, at mutually exclusive times to prevent contention on the I/O pin 14. In addition, Configurations B'18 and B'23 can accommodate a direct output in a bidirectional mode of operation since the direct output path is still available even though the output register 18 has been buried or used as a buried, intermediate stage of a shift register composed of adjacent output registers 18. Buffers Y 22 and Z 24 are used to enable the input path and the output path respectively under logic control at mutually exclusive times, via connection of the respective buffer control lines to internal interconnect 12, to prevent contention on the I/O pin 14. The above configurations are listed below with the antifuse programming required for each configuration.

Configuration B'3 has antifuses 54, 57 and 61 programmed. In this configuration, register 16 is used as the input stage of a serial input shift register with data being received via I/O pin 14. The data is first registered in register 16 and then transmitted out of register 16 to an adjacent cell 10. Through logic control of buffer Z 24, data can be transmitted in a bidirectional mode out of interconnect 12, through buffer Z 24, to I/O pin 14 for direct output. Buffers Y 22 and Z 24 are used to enable the input path and the output path respectively under logic control at mutually exclusive times, via connection of the respective buffer control lines to internal interconnect 12, to prevent contention on the I/O pin 14.

For Configuration B'8, antifuses 54, 58, 61, 64, and 66 are programmed. Register 16 operates as for Configuration B'3. This time, register 18 operates to provide registered output of data from interconnect 12 via data path "11" of MUX A 26. The data is output at pin 14 through control of buffer Z 24. Buffers Y 22 and Z 24 are used to enable the input path and the output path respectively under logic control at mutually exclusive times, via connection of the respective buffer control lines to internal interconnect 12, to prevent contention on the I/O pin 14.

Configuration B'13 has antifuses 54, 58, 61, 64, 65, and 67 or 68 programmed. Register 16 operates as for Configuration B'3. Register 18 operates as the final stage of a serial output shift register with data being received from an adjacent cell 10 via data path "10" of MUX A 26. Data is first registered in register 18 and then transmitted out of register 18 through buffer Z 24 to I/O pin 14. Buffers Y 22 and Z 24 are used to enable the input path and the output path respectively under logic control at mutually exclusive times, via connection of the respective buffer control lines to internal interconnect 12, to prevent contention on the I/O pin 14.

Configurations B'11 and B'12

I/O Cell 10 of FIG. 3 can also implement an output stage for a serial shift register implemented in adjacent output registers 18 in configurations B'11 through B'15. This can be accomplished while still using the input register 16 as a buried register (Configuration 15) or as a buried, intermediate stage of a serial shift register implemented in adjacent input registers 16 (Configuration B'14).

The other configurations (B'11, B'12, and B'13) can accommodate the input path functions which can only access to the I/O pin 14 only in a bidirectional mode of operation using buffers Y 22 and Z 24 under logic control, via connection of the respective buffer control lines to internal interconnect 12, to select the input path or the output path, respectively, at mutually exclusive times to prevent contention on the I/O pin 14. In addition, Configurations B'14 and B'15 can accommodate a direct input in a bidirectional mode of operation since the direct input path is still available even though the input register 16 has been used as a buried register or used as a buried, intermediate stage of a shift register composed of adjacent input registers 16. The above configurations are listed below with the indication of the required antifuse programming to implement each configuration.

Configuration B'11 has antifuses 58, 64, 65, and 67 or 68 programmed. Register 18 operates as the final stage of a serial output shift register with data being received from an adjacent cell 10 via data path "10" of MUX A 26. Data is first registered in register 18 and then transmitted out of register 18 through buffer Z 24 to I/O pin 14. Direct input of data received on input pin 14 is through buffer Y 22 to interconnect 12. Buffers Y 22 and Z 24 are used to enable the input path and the output path respectively under logic control at mutually exclusive times, via connection of the respective buffer control lines to internal interconnect 12, to prevent contention on the I/O pin 14.

For Configuration B'12, antifuses 54, 58, 62, 64, 65, and 67 or 68 are programmed. Register 18 operates as for Configuration B'11. Register 16 receives data from I/O pin 14. The data is transmitted out of register 16 through buffer X 20 and back to interconnect 12. Buffers Y 22 and Z 24 are used to enable the input path and the output path respectively under logic control at mutually exclusive times, via connection of the respective buffer control lines to internal interconnect 12, to prevent contention on the I/O pin 14.

Configurations B'1, B'2, B'6, and B'7

Configurations B'1, B'2, B'6, and B'7 implement bidirectional I/O with direct input and direct output (Configuration B'1), registered input with direct output (Configuration B'2), direct input with registered output (Configuration B'6), and registered input with registered output (Configuration B'7). Buffers Y 22 and Z 24 under logic control via connection of the respective buffer control lines to internal interconnect 12 allow bidirectional operation by enabling either the input path or the output path respectively under logic control at mutually exclusive times to prevent contention at the I/O pin 14.

Of course, any of the above four configurations or any other bidirectional configuration (labeled BIDIR in FIG. 4) can be dedicated to either input or output alone by programming the HIGH antifuse (antifuse 56) for buffer Y 22 or the HIGH antifuse (antifuse 60) for buffer Z 24, respectively.

The above configurations are listed below with the antifuse programming necessary to implement each configuration.

Configuration B'1 requires only antifuse 57 to Be programmed. Buffers Y 22 and Z 24 under logic control via connection of the respective buffer control lines to internal interconnect 12 allow bidirectional operation by enabling either the input path or the output path respectively under logic control at mutually exclusive times to prevent contention at the I/O pin 14.

Configuration B'2 has antifuses 54, 57, and 62 programmed. For registered input, data is received at I/O pin 14 and registered in register 16. The data is then transmitted out through buffer X 20 to interconnect 12. Direct output is from interconnect 12, through buffer Z 24 to pin 14. Buffers Y 22 and Z 24 under logic control via connection of the respective buffer control lines to internal interconnect 12 allow bidirectional operation by enabling either the input path or the output path respectively under logic control at mutually exclusive times to prevent contention at the I/O pin 14.

For Configuration B'6, antifuses 58, 64, and 66 are programmed. Registered output of data from interconnect 12 through register 18 is via data path "11" of MUX A 26 and buffer Z 24 to output pin 14. Direct input from pin 14 is through buffer Y 22, to interconnect 12. Buffers Y 22 and Z 24 under logic control via connection of the respective buffer control lines to internal interconnect 12 allow bidirectional operation by enabling either the input path or the output path respectively under logic control at mutually exclusive times to prevent contention at the I/O pin 14.

Configuration B'7 has antifuses 54, 58, 62, 64, and 66 programmed. Registered output with register 18 is as for Configuration B'6. Registered input using register 16 is as for Configuration B'2. Buffers Y 22 and Z 24 under logic control via connection of the respective buffer control lines to internal interconnect 12 allow bidirectional operation by enabling either the input path or the output path respectively under logic control at mutually exclusive times to prevent contention at the I/O pin 14.

Configuration B'26—Metastable Hardened Two Stage Input Synchronizer

The input register 16 and output register 18 in I/O cell 10 of FIG. 3 can be combined via the programmable direct link provided by MUX A 26 selection path "01" to implement a two stage synchronizer which can provide very high MTBF (Mean Time Before Failure) performance for metastable events which can occur when interfacing synchronous circuits to unpredictable, asynchronous inputs with some probability of violation of input setup time or input hold time relative to the synchronous input register clock.

For this configuration, antifuses 54, 61, 63, 66, and 69 are programmed. Data is received at I/O pin 14 and registered in register 16. The data is then transmitted out of register 16 and registered in register 18 via the "01" path of MUX A 26. Both registers 16 and 18 are clocked by the same synchronous clock signal. Data in register 18 can be transmitted to interconnect 12. Subsequent clock pulses transfer subsequent input data through the synchronizer to interconnect 12.

Dynamic Data Conversion Configurations

Configuration B'D27—Serial Data Out to Parallel Data Output

This scheme uses one of configuration B'16, B'17, B'18, B'19 or B'20 to implement a buried, intermediate stage of a serial shift register in each I/O cell 10 using output registers 18. The shift register is loaded serially from the interconnect 12 by selection of MUX A 26 input path option "11" (antifuses 64 and 66 programmed) for the first register stage and MUX A 26 input path option "10" (antifuses 64 and 65 programmed) for all other stages. For all stages except the first stage, antifuse 67 or 68 must be programmed to create the direct serial link between stages. Antifuse 58 is programmed for all shift register stages and the outputs of each I/O cell 10 are tri-stated by logic control of buffer Z 24 while the shift register is loaded serially from the interconnect 12.

Once the shift register is loaded with the desired output data, the device output is enabled via the enabling of buffer Z 24 in each I/O cell 10 to provide data to the output pins 14 in a parallel data word.

The shift register can be composed of shift register segments implemented in contiguous, adjacent I/O cells 10 but whose segments are located in physically separated portion of the chip containing the I/O cells. The output of all segments but the final one can be linked through general interconnect 12 to the input of the subsequent segment to create a longer shift string even though the segments are not located in contiguous I/O cells 10. The output of the last stage of all segments except the last segment would be routed through the general interconnect 12 to the MUX A 26 "11" input path of the first stage of the next segment. The output of the final stage of the last segment would not be connected to internal interconnect 12.

To summarize, the initial stage has antifuses 58, 64, and 66 programmed with buffer Z 24 under logic control. All other stages have antifuses 58, 64, 65, and 67 or 68 programmed, again with buffer Z 24 under logic control.

In operation, a serial load from interconnect 12 is accomplished by shifting "W" cycles for "W" stages of serial register to shift "W" bits of binary data serially into the shift register. During the shift-in operation, buffer Z 24 is disabled in all stages of the shift register. Once the serial shift register is loaded, the parallel output transfer is accomplished by enabling buffer Z 24 in each I/O cell 10 of the shift register to transfer data to output pins 14 in parallel.

Configuration B'D28—Parallel Data Out to Serial Shift Data Output

This configuration uses one of configuration B'11, B'12, B'13, B'14 or B'15 to implement the output stage of a serial shift register in one I/O cell 10 and one of configuration B'16, B'17, B'18, B'19 or B'20 to implement each of the other shift register stages. Each stage of the shift register is loaded in parallel from the interconnect 12 by selection of MUX A 26 input path option "11" (antifuses 64 and 67 or 68 programmed and Cl switched to HIGH or "1" under logic control) prior to the first rising edge of the output register clock which clocks all stages in unison for one clock cycle.

The MUX A 26 input path option is switched to path "10" for all stages except the first stage for subsequent clock cycles (C1 switched to LOW or "0" under logic control via connection of the MUX A 26 select line to internal interconnect 12) and on each subsequent rising clock edge data is shifted in the serial shift register and is shifted out of the I/O pin 14 of the last stage. The MUX A 26 input path option for the first register stage is programmed for input path option "11" always selected by programming antifuses 64 and 66 so that on the first shifting clock edge an internal serial bit stream can be appended, if desired, to the stream which was loaded in parallel. This allows multiple bit streams to be easily concatenated. Alternatively, the shift register can be loaded with trailing 1s or 0s if desired.

This scheme also allows a barrel or circular shift to be implemented after a parallel load by feeding the output of the last stage register back to the input of the first stage of the shift register through the internal interconnect 12. This is accomplished by enabling buffer ZZ 30 in the last stage and routing the output of that stage back through the interconnect 12 to the "11" input path of the first stage. During circular shift, the buffer Z 24 in the last stage would be disabled. Upon completion of circular shift the buffer ZZ 30 in the last stage would be disabled, the buffer Z 24 in the last stage would be enabled, and data would be serially shifted out the I/O pin 14 of the last register stage.

The shift register can be composed of shift register segments implemented in register 18 of contiguous, adjacent I/O cells 10 but whose segments are located in physically separated portions of the chip containing the I/O cells. The output of all segments but the final one can be can be linked through general interconnect 12 to the input of the subsequent segment to create a longer shift string even though the segments are not located in contiguous I/O cells 10. After a parallel load, the output of the last stage of all segments except the last segment would be enabled via buffer ZZ 30 and routed through the general interconnect 12 to the MUX A 26 "11" input path of the first stage of the next segment. The "11" MUX A 26 input path of each segment first stage would not be switched to "11" path after the parallel load but would remain set at "11". The internal source for the original parallel load would be disabled to avoid contention on the "11" path during the serial shift. The output of the final stage of the last segment would have Buffer Z 24 enabled to allow a shift out of the serial data stream at the I/O pin 14.

To summarize, the initial stage of the shift register has antifuses 64 and 66 programmed (or under logic control for a circular shift). The intermediate stages have antifuses 64, and 67 or 68 programmed, with C1 under logic control via connection of the MUX A 26 select line to internal interconnect 12. Buffer ZZ 30 is held off via programming of antifuse 70. The final stage has antifuses 58, 60, 64, and 67 or 68 programmed, with C1 under logic control. Buffer ZZ 30 is programmed off via programming of antifuse 70 (or under logic control for a circular shift).

The parallel load operation is as follows: The MUX A 26 input path is switched under logic control to path "11". On the first clock edge, all output registers 18 are loaded in parallel from the internal interconnect 12. For the serial output shift, the MUX A 26 input path is switched under logic control to "10", except for the first stage which is fixed at MUX A 26 path "11". "W" subsequent clock pulses shift "W" cycles for "W" stages of serial register to shift "W" bits of binary data serially out of the I/O pin 14 of the last stage.

For circular shift operation, the output of the last stage is routed back through the internal interconnect 12 via enabling of buffer ZZ 30 to the "11" path of MUX A 26 of the fist stage to implement the circular shift. Buffer Z 24 is disabled during the circular shift. Subsequent to the completion of the circular shift, buffer ZZ 30 is disabled and buffer Z 24 is enabled to allow the serial data stream to be shifted out of the I/O pin 14 of the last shift register stage.

Configuration B'D29—Serial Data Shift Input to Parallel Data Input

The addition of buffer X 20 in I/O cell 10 of FIG. 3 allows isolation of the input path from each input register 16 during a serial input register load. This allows serial-to-parallel input data conversion by avoiding the toggling of internal interconnect 12 while the serial input register implemented in adjacent input registers 16 is being loaded. Tri-state buffer X 20 can be enabled once the serial shift register has been loaded to allow the content of the shift register to be transferred to the internal interconnect 12 as a parallel data word.

One of Configurations B'3, B'8, B'13, B'18 or B'23 is utilized for the input shift register input stage. One of Configurations B'4, B'9, B'14, B'19, or B'24 is used for each of the subsequent shift register stages. Once the shift register is loaded, buffer X 20 in each I/O cell 10 containing an input shift register stage is enabled allowing the serially loaded data to be transferred in parallel into the internal interconnect 12.

The shift register can be composed of shift register segments implemented in register 16 of contiguous, but whose segments are located in physically separated portion of the chip containing the I/O cells. The output of all segments but the final one can be linked through general interconnect 12 to the input of the subsequent segment to create a longer shift string even though the segments are not located in contiguous I/O cells 10. The output of the last stage of all segments except the last segment would be routed through the general internal interconnect 12 to the buried input path (antifuse 53 path) of the input register 16 of the first stage of the subsequent shift register segment and antifuses 50 and 51 would remain unprogrammed. Buffer X 20 in the last stage of each segment would be enabled during serial shift and would toggle the interconnect path which would also pass the parallel data in after the serial shift is completed. Care is necessary to insure that these toggling data paths during serial shifting in are isolated from the internal destination which receives the parallel data after completion of the serial shift in.

To summarize, the input stage has antifuse 54 programmed, with buffer X 20 under logic control via connection of the buffer control line to internal interconnect 12. All other stages have antifuses 50 or 51, and 53 programmed, with buffer X 20 under logic control via connection of the buffer control line to interconnect 12.

In operation, the serial input load is accomplished as follows: A shift of "W" cycles for "W" stages of serial register is used to shift "W" bits of binary data serially into the shift register via first stage I/O pin 14. Buffer X 20 is disabled in all shift register stages during this load. If a multiple segment shift register is implemented, buffer X 20 in the last stage of each segment would be enabled during the serial shift in and would toggle the interconnect path which would also pass parallel data in after the serial shift in is completed. Care is required to insure that these toggling data paths during the serial shift in are isolated from the internal destination which receives the parallel data after completion of the serial shift in.

After the serial shift register has been loaded, the parallel input transfer is accomplished by enabling buffer X 20 in each I/O cell 10 of the shift register to transfer the data in parallel into internal interconnect 12.

Configuration B'D30—Parallel Data Input to Serial Data Shift Input

Configuration B'26 is implemented in each stage of the serial register. In each cell 10, the input register 16 is loaded in parallel from I/O pin 14 via a single clock pulse applied to each input cell 10 of the parallel data word. MUX A 26 is set by logic control to the "01" input path. On the next rising clock edge, the content of the input register 16 is transferred to and registered in the output register 18 in the same cell 10. Then MUX A 26 is switched under logic control to select input data path "10" in each I/O cell 10 and the data in the serial shift register composed of output registers 18 in adjacent I/O cells 10 is shifted one stage on each subsequent rising edge of the register clock. Antifuse 67 or 68 is programmed in each cell 10 to allow data to be transferred to the next I/O cell 10 output register 18. The output from the last shift register stage is transferred to the internal interconnect 12 by enabling buffer ZZ 30.

The first shift register stage implemented in the output register 18 of the I/O cell 10 used for the first register stage is switched to select MUX A 26 input path option "11" after parallel loading via path "11" from the input register 16 in the same I/O cell 10. This allows a second serial bit stream to be appended, if desired, from the internal interconnect 12. Alternatively, the shift register can be filled with trailing 1s or 0s via this path. All other cells 10 in the shift register select MUX A 26 input path "11" to allow data to be transferred to the next shift register stage implemented in the output register 18 of the next I/O cell 10 via antifuse connection 67 or 68.

By switching the initial stage output register 18 to MUX A 26 input path option "11" after the output register 18 has been loaded from the associated input register, a circular shift of the shift register can be performed by connecting through the internal interconnect 12, the output of the last stage back to the input of the first stage. After the circular shift, the rotated data stream can be shifted from the last register stage to its destination through the internal interconnect 12. After the circular shift is complete, the input path of the first output register 18 in the shift register should be switched back to the "10" path to prevent the circular shift of the register from continuing during the serial shift in operation. Antifuses 67 and 68 should be left unprogrammed for this input path and the input path should default LOW to allow the shift register to be filled with trailing 0s.

During circular shift, buffer ZZ 30 of the last stage is enabled and the internal interconnect 12 on which serial data will be shifted into the internal logic of the device after the circular shift is complete is toggled during the circular shift. If circular shift is implemented, this input path should be isolated from the internal destination during this shift since buffer ZZ 30 in the last stage will be enabled and toggling.

The serial shift register can be composed of shift register segments implemented in contiguous, adjacent I/O cells 10 but whose segments are located in physically separated portion of the chip containing the I/O cells. The output of all segments but the final one can be linked through general internal interconnect 12 to the input of the subsequent segment to create a longer shift string even though the segments are not located in contiguous I/O cells 10. The output of the last stage of all segments except the last segment would be routed through the general internal interconnect 12 to the MUX A 26 input path option "11" of the output register 18 of the I/O cell 10 comprising the first stage of the subsequent shift register segment and antifuses 67 and 68 would remain unprogrammed for the first stage of that subsequent shift register segment. The "11" MUX A 26 input path of each segment first stage would not be switched to "10" after the parallel load but would be disabled to avoid contention on the "11" path during the serial shift. The output of the final stage of the last segment would be connected to internal interconnect 12 to allow serial shift in of the data stream.

To summarize, the initial stage has antifuses 54 and 61 programmed, with C1 and C1 under logic control via connection of the C0 and C1 select lines to interconnect 12. Antifuses 67 and 68 are unprogrammed. All intermediate stages have antifuses 54, 61, and 67 or 68 programmed with C0 and C1 under logic control. The final stage has antifuses 54, 61, 67 or 68, and 69 programmed with C0 and C1 under logic control.

The parallel load is accomplished as follows: MUX A 26 is set to input path option "01" under logic control for all I/O cells 10 comprising the serial shift register. Two clock pulses on all associated input registers 16 and output registers 18 loads input data into the input register 16 of each cell 10 and transfers that data to the output register 18 in each cell 10.

The serial shift in requires the MUX A 26 input path being switched to input path option "10" for all register stages except for the first register stage which is switched to MUX A 26 input path option "11". "W" clock pulses shift "W" bits from "W" stages into the internal interconnect 12. Another serial stream can be appended from the internal interconnect 12 to the end of the first stream via the "11" path of the first stage output register 18. The "11" MUX A 26 path of each segment first stage would not be switched to "10" after the parallel load but would remain set at "11". The internal source for the original parallel load would be disabled to avoid contention on the "11" path during the serial shift in.

Alternatively, a circular data shift is accomplished by connecting the output of the last stage, via the internal interconnect 12, to the MUX A 26 input path option "11" of the first stage of the shift register. Each subsequent clock pulse shifts data one stage in a circular fashion. After the circular shift, the first stage is switched to the "10" path to prevent the circular shift from continuing during the serial shift in. Data is serially shifted into the interconnect 12 from the serial shift register via buffer ZZ 30 which is permanently enabled in the last shift register stage via programming of antifuse 69. During circular shift, buffer ZZ 30 of the last stage is enabled and the internal interconnect 12 on which serial data will be shifted into the internal logic of the device after the circular shift is complete is toggled during the circular shift. If circular shift is implemented, this input path should be isolated from the internal destination during this shift since buffer ZZ 30 in the last stage will be enabled and toggling.

Configuration B'D31—Internal Serial to Parallel Data Conversion in Input Registers Configuration B'D29 can be modified to allow internal serial-to-parallel data conversion using the serial connection of adjacent I/O cell 10 input registers 16. This is accomplished by configuring the input path of the first stage input register 16 as a buried register via Configuration B'5, B'10, B'15, B'20 or B'25.

The shift register can be composed of shift register segments implemented in contiguous, adjacent I/O cells 10 but whose segments are located in physically separated portions of the chip containing the I/O cells. The output of all segments but the final one can be linked through general internal interconnect 12 to the input of the subsequent segment to create a longer shift string even though the segments are not located in contiguous I/O cells 10. The output of the last stage of all segments except the last segment would be routed through the general interconnect 12 to the buried input path of the input register 16 of the I/O cell 10 comprising the first stage of the subsequent shift register segment and antifuses 50 and 51 would remain unprogrammed for that first segment stage. Buffer X 20 would be enabled and toggling in the last stage of each shift register segment during serial shift in. Care should be taken to isolate, during the serial shift, the interconnect 12 line driven by each segment's last stage from the eventual internal destination which receives parallel data on that line after serial shift is complete.

For the initial stage configuration, antifuse 53 is programmed and buffer X 20 is logic controlled via connection of the buffer control line to internal interconnect 12. For all other stages, antifuses 50 or 51, and 53 are programmed and buffer X 20 is logic controlled via connection of the buffer control line to internal interconnect 12.

In operation, the serial load is accomplished as follows: Buffer X 20 is disabled under logic control. "W" clock pulses then shift "W" bits of serial data from the internal interconnect 12 into "W" serial shift register stages implemented in I/O cell 10 input registers 16. If a multiple segment shift register is implemented, Buffer X would be enabled and toggling in the last stage of each shift register segment during serial shift in. Care should be taken to isolate during serial shift the interconnect line driven by each segment's last stage from the eventual internal destination which receives parallel data on that line after serial shift is complete. After the serial load is complete, the parallel transfer is achieved by enabling buffer X 20 in each I/O cell 10 of the shift register, to transfer parallel data to the internal interconnect 12.

Configuration B'D32—Internal Serial to Parallel Data Conversion in Output Registers Configuration B'D32 allows internal serial-to-parallel data conversion using the serial connection of adjacent I/O cell 10 output registers 18. This is accomplished by configuring the output path of the first stage output register 18 as a buried register via configuration B'21, B'22, B'23, B'24 or B'25.

The shift register can be composed of shift register segments implemented in contiguous, adjacent I/O cells 10 but whose segments are located in physically separated portions of the chip containing the I/O cells. The output of all segments but the final one can be linked through general internal interconnect 12 to the input of the subsequent segment to create a longer shift string even though the segments are not located in contiguous I/O cells 10. The output of the last stage of all segments except the last segment would be routed through the general interconnect 12 to the buried input path (MUX A 26 path option "11") of the output register 18 of the I/O cell 10 comprising the first stage segment and antifuses 67 and 68 would remain unprogrammed for that first stage. Buffer ZZ 30 would be enabled and toggling in the last stage of each shift register segment during the serial shift. Care should be taken to isolate, during serial shift, the interconnect line driven by each segment's last stage from the eventual internal destination which receives parallel data on that line after the serial shift is complete.

The initial stage configuration has antifuse 64 and 66 programmed with buffer ZZ 30 logic controlled. The other stages have antifuses 64, 65, and 67 or 68 programmed with buffer ZZ 30 under logic control.

The serial load is accomplished as follows: Buffer ZZ 30 is disabled under logic control. "W" clock pulses then shift "W" bits of serial data from the internal interconnect 12 into "W" serial shift register stages implemented in I/O cell 10 output registers 18. If a multiple segment shift register is implemented, buffer ZZ 30 would be enabled and toggling in the last stage of each shift register segment during the serial shift. Care should be taken to isolate, during the serial shift, the interconnect line driven by each segment's last stage from the eventual internal destination which receives parallel data on that line after the serial shift is complete. To perform the parallel transfer after the serial load is complete, enable buffer ZZ 30 in each I/O cell 10 to transfer parallel data to the internal interconnect 12.

Configuration B'33—Word Wide Input FIFO with Random Read and Word Shuffle

A first word wide input FIFO can be implemented in I/O cell 10 by extending configuration B'26 beyond two stages by appending additional I/O cell 10 output registers 18 and creating a shift register for each bit of the data word. All but the first FIFO location are constructed in I/O cell 10 output registers 18. Buffer Z 24 in disabled in each shift register stage to prevent contention on I/O pin 14. Buffer X 20 is disabled in the first shift register stage for each bit of the data word to prevent input data from toggling the internal interconnect 12.

The initial stage and second stage configuration has antifuses 54, 55, and 59 programmed. Antifuse 61 is programmed or buffer X 20 is placed under logic control for shuffle and random read. Antifuse 70 is programmed or buffer ZZ 30 is under logic control for random read. Antifuses 63 and 66 are programmed or C0 and C1 are under logic control for shuffle and random write.

The intermediate stages have antifuses 59 and 67 or 68 programmed. Antifuses 64 and 65 are programmed or C0 and C1 are placed under logic control for shuffle and random write. Antifuse 70 is programmed or buffer ZZ 30 is placed under logic control for random read.

The final stage configuration has antifuses 59 and 67 or 68 programmed. Antifuses 64 and 65 are programmed or C0 and C1 are placed under logic control for shuffle and random write. Antifuse 69 is programmed or buffer ZZ is placed under logic control for random read.

The operation of this first FIFO is as follows: A FIFO load is accomplished by shifting "W" cycles for "W" stages of serial register for each bit of the data word, to shift "W" words of binary data from the I/O pin 14 of the first stage into FIFO locations. Buffer Z 24 is disabled to prevent contention on the I/O pin 14 during FIFO input.

The first FIFO can accomplish shuffling of words in the FIFO by maintaining logic control of buffer X 20 in the first FIFO stage, via connection of the buffer control line to internal interconnect 12, and maintaining the MUX A 26 input path select line C1 under logic control for the second through final stages of the FIFO, via connection of the select line C1 to internal interconnect 12. By enabling buffer X 20 in the first word, once loaded, and by switching the input path to MUX A 26 for any word to the "11" path, the content of the first stage can be loaded into any of the subsequent stages through the internal interconnect 12 to allow assembly of incoming data words in any order. After the transfer of data from the first location to the destination location via its MUX A 26 "11" input path, the MUX A 26 select line C1 can be switched to LOW or "0" to allow FIFO shift to occur via the MUX A 26 path "10 ".

The output of any FIFO location implemented in output registers 18 (all but the first FIFO location) in the first FIFO can be routed through the internal interconnect 12 to the MUX A 26 input path of any FIFO stage to accomplish a shuffling of the words in the FIFO. Transfer of any word location to the internal interconnect 12 is accomplished by selectively enabling buffer ZZ 30 in the cells 10 representing the word to written to another FIFO location. By leaving MUX A 26 input path option selection under logic control for each cell 10 and selecting MUX A 26 input path option "11" for the registers which represent the word to be written over and clocking only those registers, the data word is transferred to the new FIFO location. Of course, to preserve the contents of the location to be written over for writing back to the location from which the first word was transferred, another word register must be implemented in I/O registers to save the contents of the location to be written over before the transfer is initiated.

A second word wide input FIFO can also be constructed using input registers 16. Buffer X 20 is disabled in each cell 10 to prevent toggling of interconnect 12 during FIFO shifting. The buffer X 20 in the last stage is enabled to allow the last FIFO location to be read into the internal interconnect 12.

The second FIFO constructed of input registers 16 can be configured such that after serial load of the FIFO is complete any word of the FIFO can be transferred in parallel to the internal interconnect 12. This is accomplished by leaving buffer X 20 under logic control, via connection of the buffer control line to internal interconnect 12, and selectively enabling buffer X 20 for the shift register stages representing the data word to be transferred to the internal interconnect 12. By this means, random access for read of FIFO locations can be accomplished.

For each bit of the FIFO data word, the initial stage configuration has antifuses 54, 55, and 59 programmed for the first sequential stage. Antifuse 61 is programmed or buffer X 20 is kept under logic control for random read. The intermediate stages have antifuses 50 or 51 and 53 programmed. Antifuse 61 is programmed or buffer X 20 is kept under logic control for random read. The final stage has antifuses 50 or 51 and 53 programmed. Antifuse 62 is programmed or buffer X 20 is kept under logic control for random read.

The second FIFO loads by shifting "W" cycles for "W" stages of serial register for each bit of the data word, to shift "W" words of binary data into FIFO locations. Buffer X 20 is disabled in all but the last FIFO stage to prevent toggling of the internal interconnect 12 during FIFO shift in.

Configuration B'34—Word Wide Output FIFO with Random Write, Random Read and Word Shuffle A word wide output FIFO can be implemented in I/O cell 10 of FIG. 3 by creating a serial output shift register using I/O cell 10 output registers 18 for each bit of the FIFO data word. For each bit of the FIFO data word, the initial stage configuration has antifuses 55 and 59 programmed. Antifuses 64 and 66 are programmed or C0 and C1 are placed under logic control for circular shift or random write. Antifuse 70 is programmed or buffer ZZ 30 is kept under logic control for shuffle and random read. The intermediate stages have antifuses 55, 59, and 67 or 68 programmed. Antifuses 64 and 65 are programmed or C0 and C1 are placed under logic control for random write. Antifuse 70 is programmed or buffer ZZ 30 is kept under logic control for shuffle and random read. The final stage has antifuses 58 and 67 or 68 programmed. Antifuses 64 and 65 are programmed or C0 and C1 are placed under logic control for random write.

Antifuse 60 is programmed or buffer Z 24 is kept under logic control for circular shift. Antifuse 70 is programmed or buffer ZZ 30 is kept under logic control for circular shift, shuffle and random read.

In operation, a FIFO load is accomplished by shifting "W" cycles for "W" stages of serial register, to shift "W" words of binary data into FIFO locations. Buffer Z 24 is disabled for all but the last FIFO location to allow the input path of each I/O cell 10 to be used for input functions.

Once the FIFO is loaded, any location of the FIFO can be written at random from the internal interconnect 12. This is accomplished by leaving MUX A 26 input select lines C0 and C1, under logic control and selecting MUX A 26 input path option "11" for the registers which represent the word to be written and clocking only those registers to write a new data word from the internal interconnect 12. This approach allows FIFO words to be assembled in any order and then shifted out sequentially.

The output of the last FIFO location can be routed through the internal interconnect 12 to the "11" MUX A 26 input path of the first FIFO stage to accomplish a circular shift of the words in the FIFO by enabling buffer ZZ 30 in the last stage. By leaving the control of buffer Z 24 in the final FIFO stage under logic control, via connection of the buffer control line to internal interconnect 12, and disabled during circular shift, once the FIFO has been circularly shifted the FIFO contents can be shifted out of the output pins 14 on subsequent clock edges by enabling buffer Z 24 in the last stage and disabling buffer ZZ 30 in each stage.

The output of any FIFO location can be routed through the internal interconnect 12 to the "11" MUX A 26 input path of any FIFO stage to accomplish a shuffling of the words in the FIFO. Transfer of any word location to the internal interconnect 12 is accomplished by selectively enabling buffer ZZ 30 in the cells representing the word to be written to another FIFO location. By leaving MUX A 26 input path option "11" for the registers which represent the word to be written over and clocking only those registers, the data word is transferred to the new FIFO location. Of course, to preserve the contents of the location to be written over for writing back to the location from which the first word was transferred, another word register must be implemented in I/O registers to save the contents of the location to be written over before the transfer is initiated. By leaving the control of buffer Z 24 in the final FIFO stage under logic control, via connection of the buffer control line to internal interconnect 12, once the FIFO contents have been shuffled, the FIFO contents can be shifted out of the output pins on subsequent clock edges by enabling buffer Z 24 in the last stage and disabling buffer ZZ 30 in each cell 10.

Configuration B'35—I/O Registers Used as a Buried Register File

Any of the configurations B'5, B'10, B'15, B'20 or B'25 can be used to store and retrieve parallel data words of any length by parallel clocking of data into a bank of I/O cell 10 input dependers 16 by clocking each bank of input registers 16 independently while passing input data from an internal interconnect 12 data bus to the input path of the input registers 16 of the corresponding I/O cells 10 via antifuse connection 53. The content of any location may be read out to the internal interconnect 12 data bus by selectively enabling the buffer X 20 under logic control, via connection of the buffer control line to internal interconnect 12, for the word to be read onto the internal interconnect 12 data bus. The availability of the buffer X 20 in each I/O cell 10 allows the same data bus in the internal interconnect 12 to be used for reading the content of the register file locations.

In this configuration, each I/O cell 10 has antifuse 53 programmed with buffer X 20 under logic control via connection of the buffer control line to internal interconnect 12. Each bank of I/O cell 10 input registers 16 are clocked form a different clock signal source.

Configuration B'36—Output Registers Used as a Buried Register File

Any of the configurations B'21, B'22, B'23, B'24 or B'25 can be used to store and retrieve parallel data words of any length by parallel clocking of data into a bank of I/O cell 10 output registers 18 by clocking each bank of output registers 18 independently while passing input data from an internal interconnect 12 data bus to the input path (MUX A 26 path option "11") of the output registers 18 of the corresponding I/O cells 10. The content of any location may be read out to the internal interconnect 12 data bus by selectively enabling the buffer ZZ 30 under logic control, via connection of the buffer control line to internal interconnect 12, for the word to be read onto the internal interconnect 12 data bus. The availability of the Buffer ZZ 30 in each I/O cell 10 allows the same data bus in the internal interconnect 12 to be used for reading the content of all of the register file locations.

In this configuration, each I/O cell 10 has antifuses 59, 64, and 66 programmed. Buffer ZZ 30 is under logic control via connection of the buffer control line to internal interconnect 12. Each bank of I/O cell 10 output registers 18 is clocked form a different clock signal source.

Configuration B'37—Demultiplexing of Internal Serial Data in Input Registers

The internal serial-to-parallel conversion of Configuration B'D31 above can be used to load the input serial shift register implemented in input registers 16 of adjacent I/O cells 10. By selectively enabling the buffer X 20 under logic control (via connection of the buffer control line to internal interconnect 12) in subsets of the I/O cells 10 from which the serial shift register is constructed, demultiplexing of the serial stream can be accomplished as parallel data is transferred onto the internal interconnect 12 output data bus. Parallel data can be retrieved at random from any segment of the serial stream by enabling the buffer X 20 in the appropriate I/O cells 10 to read the content of the cells' input register 16 to an internal interconnect 12 bus. Care must be taken to prevent bus contention by insuring that only one shift register stage is enabled for each shared internal interconnect 12 output bus line which is shared by the same bit location of each of the subsets demultiplexed from the serial data stream.

In this configuration, the initial stage has antifuse 53 programmed and buffer X 20 is under logic control via connection of the buffer control line to internal interconnect 12. All other stages have antifuses 50 or 51 and 53 programmed with buffer X 20 under logic control via connection of the buffer control line to internal interconnect 12.

In operation, the serial load is accomplished by shifting "W" cycles for "W" serial stages to shift "W" bits of binary data into "W" shift register stages from the internal interconnect 12 serial input line. Buffer X 20 is disabled in each I/O cell 10 to prevent toggling of internal interconnect 12 output bus during this serial load. The parallel transfer is made after completion of the serial load. Selected subsets of the serial stream are transferred by selectively enabling the buffer X 20 in the I/O cells 10 corresponding to the subset of serial shift register locations to be transferred to the internal interconnect 12 output bus.

Configuration B'38—Demultiplexing of Internal Serial Data in Output Registers

The internal serial to parallel conversion of data can also be accomplished in output registers 18 of adjacent I/O cells 10. By selectively enabling the buffer ZZ 30 under logic control (via connection of the buffer control line to internal interconnect 12) in subsets of the I/O cells 10 from which the serial shift register is constructed, demultiplexing of the serial stream can be accomplished as parallel data is transferred onto the internal interconnect 12 output data bus. Parallel data can be retrieved at random from any segment of the serial stream by enabling the buffer ZZ 30 in the appropriate I/O cells 10 to read the content of the cells' output registers 18 to an internal interconnect 12 bus. Care must be taken to prevent bus contention by insuring that only one shift register stage is enabled for each shared internal interconnect 12 output bus line which is shared by the same bit location of each of the subsets demultiplexed from the serial data stream.

In this configuration, the initial stage has antifuses 64 and 66 programmed with buffer ZZ 30 under logic control via connection of the buffer control line to internal interconnect 12. The other stages have antifuses 64, 66, and 67 or 68 programmed. Again buffer ZZ 30 is under logic control via connection of the buffer control line to internal interconnect 12.

The serial load is accomplished by shifting "W" cycles for "W" serial stages to shift "W" bits of binary data into "W" shift register stages from the internal interconnect 12 serial input line. Buffer ZZ 30 is disabled in each I/O cell 10 to prevent toggling of internal interconnect 12 output bus during this serial load. The parallel transfer is completed after the serial load. Selected subsets of the serial stream are transferred by selectively enabling the buffer ZZ 30 in the I/O cells 10 corresponding to the subset of serial shift register locations to be transferred to the internal interconnect 12 output bus.

Configuration B'39—Multiplexing of Internal Serial Data in Input & Output Registers Two serial internal data streams can be multiplexed onto the same serial line in internal interconnect 12 or can be multiplexed onto a parallel internal bus of any width by creating two internal shift registers in a group of I/O cells 10. One shift register would be constructed in the input registers 16 and the second shift register would be constructed in the output registers 18 of the same I/O cells 10. By clocking the shift registers with the same clock and alternately enabling buffer X 20 and buffer ZZ 30, the two serial streams could be multiplexed onto the same serial interconnect line. Alternatively the two serial streams could be converted to parallel data and multiplexed onto the same internal interconnect 12 bus.

For the input register 16 shift register, the initial stage has antifuse 53 programmed and buffer X 20 is placed under logic control via connection of the buffer control line to internal interconnect 12. Other stages have antifuses 50 or 51 and 53 programmed with buffer X 20 under logic control via connection of the buffer control line to internal interconnect 12.

The output register 18 shift register configuration is as follows: The initial stage has antifuses 64 and 66 programmed and buffer ZZ 30 under logic control via connection of the buffer control line to internal interconnect 12. The other stages have antifuses 64, 65, and 67 or 68 programmed with buffer ZZ 30 under logic control via connection of the buffer control line to internal interconnect 12.

Operation is as follows: The input register 16 shift register serial load is accomplished by shifting "W" cycles for "W" serial stages to shift "W" bits of binary data into "W" shift register stages from the internal interconnect 12 serial input line. Buffer X 20 is disabled in each I/O cell 10 to prevent toggling of internal interconnect 12 output bus during the serial load. The output register 18 shift register serial load takes place by shifting "W" cycles for "W" serial stages to shift "W" bits of binary data into "W" shift register stages from the internal interconnect 12 serial input line. Buffer ZZ 30 is disabled in each I/O cell 10 to prevent toggling of internal interconnect 12 output bus during this serial load.

The serial multiplex transfer is accomplished by clocking the data into a serial destination register at a clock rate twice that of the serial shift register stages and by alternately enabling buffer X 20 and buffer ZZ 30. This creates an internal serial data stream in which the two serial streams are interleaved. A single data stream which is created by serializing selected mutually exclusive segments sections of each of the two serial streams can be created by enabling one or the other of the two buffers X 20 and ZZ 30 while clocking a serial destination register at the same clock rate as that of the two serial source shift registers.

Parallel multiplex transfer is as follows: Selected subsets of the two serial streams can be transferred in parallel to the internal interconnect 12 by selectively enabling either buffer ZZ 30 or buffer X 20 in the I/O cells 10 corresponding to the subset of serial shift register locations to be transferred in parallel to the internal interconnect 12 data bus.

Thus, a novel programmable I/O cell with data conversion capability has been described. The features of the I/O cell allow the configurations and the data conversion options described in I/O registers which would require use of additional registers in the logic cells of prior FPGA architectures. Although the teachings have been presented in connection with a particular circuit embodiment, it should be understood that the methods of the present invention are equally applicable to a number of systems. Therefore, the disclosure should be construed as being exemplary and not limiting and the scope of the invention should be measured only in terms of the appended claims.

What is claimed is:

1. A programmable input/output cell for a programmable logic device having a programmable interconnect matrix (PIM), the programmable input/output cell comprising:
    an input/output pad;
    a first register having an input adaptable to be coupled to the input/output pad and further having an output coupled to a first dedicated signal path separate from the PIM to a pair of adjacent input/output cells; and
    a second register having an output adaptable to be coupled to the input/output pad and coupled to a second dedicated signal path separate from the PIM to the pair of adjacent input/output cells.

2. A programmable input/output cell as in claim 1 further comprising a first buffer having an input coupled to the output of the first register, the first buffer adaptable to be under the control of a first signal from the PIM.

3. A programmable input/output cell as in claim 2 wherein the first buffer further having an output adaptable to be coupled to the PIM.

4. A programmable input/output cell as in claim 1 further comprising a first buffer having an output coupled to the input/output pad, the first buffer adaptable to be under the control of a first signal from the programmable interconnect matrix.

5. A programmable input/output cell as in claim 4 wherein the first buffer further having an input adaptable to be coupled to the PIM.

6. A programmable input/output cell as in claim 5 wherein the input of the first buffer is further adaptable to be coupled to the output of the second register.

7. A programmable input/output cell as in claim 4 further comprising a second buffer having an input coupled to input/output pad, the second buffer adaptable to be under the control of a second signal from the PIM.

8. A programmable input/output cell as in claim 7 wherein the second buffer having an output adaptable to be coupled to the PIM.

9. A programmable input/output cell as in claim 7 further comprising a third buffer having an input coupled to the output of the second register, the third buffer adaptable to be under the control of a third signal from the PIM.

10. A programmable input/output cell as in claim 9 wherein the third buffer further having an output adaptable to be coupled to the PIM.

11. A programmable input/output cell as in claim 1 wherein an input of the second register is adaptable to be coupled to the PIM.

12. A programmable input/output cell as in claim 11 wherein the input of the second register is further adaptable to be coupled to a register output of a first of the pair of adjacent input/output cells.

13. A programmable input/output cell as in claim 12 wherein the output of the first register is further adaptable to be coupled to the input of the second register.

14. A programmable input/output cell as in claim 13 wherein the output of the first register is further adaptable to be coupled to a register input of the first of the pair of adjacent input/output cells.

15. A programmable input/output cell as in claim 14 wherein the input of the second register is further adaptable to be coupled to a register output of a second of the pair of adjacent input/output cells.

16. A programmable input/output cell as in claim 1 wherein the input/output pad is further adaptable to be coupled to the PIM.

17. A programmable input/output cell as in claim 16 wherein the output of the second register is further adaptable to be coupled to an input of a first register of a first of the adjacent input/output cells.

18. A programmable input/output cell as in claim 17 wherein the output of the first register is further adaptable to be coupled to an input of a second register of the first of the adjacent input/output cells.

19. A programmable input/output cell as in claim 1 wherein the first register is adaptable to be under the control of a first signal from the PIM.

20. A programmable input/output cell as in claim 19 wherein the second register is adaptable to be under the control of a second signal from the PIM.

21. A method comprising the steps of:
    receiving a first bit of a serial data stream at a first register of a first input/output cell of a programmable logic device having a programmable interconnect matrix, the first input/output cell including a second register, the first register having an output coupled to a first dedicated signal path separate from the programmable interconnect matrix to a pair of adjacent input/output cells, the second register having an input adaptable to be coupled to the output of the first register and an output coupled to a second dedicated signal path separate from the programmable interconnect matrix to the pair of adjacent input/output cells;
    registering the first bit in the first register; and
    transmitting the first bit from the first register to the second register and registering the first bit in the second register.

22. A method of multiplexing two data streams in a programmable logic device including comprising the steps of:
    receiving a first bit of a first data stream from the programmable interconnect matrix at an input of a first register of a first input/output cell of the programmable logic device and registering the first bit of the first data stream in the first register, the first register having an output coupled to a first dedicated signal path separate from the programmable interconnect matrix to a pair of adjacent input/output cells;
    receiving a first bit of a second data stream from the programmable interconnect matrix at an input of a second register of the first input/output cell and registering the first bit of the second data stream in the second register the second register having an output coupled to a second dedicated signal path separate from the programmable interconnect matrix to the pair of adjacent input/output cells;
    transmitting the first bit of the first data stream from the first register to a third register of a second input/output cell of the programmable logic device and registering the first bit of the first data stream in the third register;
    transmitting the first bit of the second data stream from the second register to a fourth register of the second input/output cell and registering the first bit of the second data stream in the fourth register; and
    transmitting the first bit of the first data stream from the third register and the first bit of the second data stream from the fourth register to the programmable interconnect matrix, such that the first bit of the first data stream and the first bit of the second data stream comprise first and second bits of a serial data stream in the programmable interconnect matrix.

23. A method of multiplexing two data streams in a programmable logic device including comprising the steps of:

receiving a first bit of a first data stream from the programmable interconnect matrix at an input of a first register of a first input/output cell of the programmable logic device and registering the first bit of the first data stream in the first register, the first register having an output coupled to a first dedicated signal path separate from the programmable interconnect matrix to a pair of adjacent input/output cells;

receiving a first bit of a second data stream from the programmable interconnect matrix at an input of a second register of the first input/output cell and registering the first bit of the second data stream in the second register, the second register having an output coupled to a second dedicated signal path separate from the programmable interconnect matrix to the pair of adjacent input/output cells;

transmitting the first bit of the first data stream from the first register to a third register of a second input/output cell of the programmable logic device and registering the first bit of the first data stream in the third register;

transmitting the first bit of the second data stream from the second register to a fourth register of the second input/output cell and registering the first bit of the second data stream in the fourth register; and transmitting the first bit of the first data stream from the third register and the first bit of the second data stream from the fourth register to the programmable interconnect matrix in parallel, such that the first bit of the first data stream and the first bit of the second data stream comprise first and second bits of a parallel data word in the programmable interconnect matrix.

24. A method of multiplexing two data streams in a programmable logic device having a programmable interconnect matrix, the programmable logic device including:

a plurality of input/output cells having a first register and a second register, the first register of each input/output cell having an input adaptable to be coupled to the programmable interconnect matrix or to a first dedicated signal path separate from the programmable interconnect matrix from an adjacent input/output cell, and an output coupled to a second dedicated signal path separate from the programmable interconnect matrix to each of two adjacent ones of the input/output cells, the second register of each input/output cell having an input adaptable to be coupled to the programmable interconnect matrix or to a third dedicated signal path separate from the programmable interconnect matrix from an adjacent input/output cell and an output coupled to a fourth dedicated signal path separate from the programmable interconnect matrix to the two adjacent ones of the input/output cells, the method comprising the steps of:

receiving a first data stream having a plurality of bits from the programmable interconnect matrix at the input of the first register of a first one of the plurality of input/output cells;

receiving a second data stream having a plurality of bits from the programmable interconnect matrix at the input of the second register of the first one of the plurality of input/output cells;

coupling at least two of the first registers of the input/output cells through the second dedicated signal paths so as to form a first serial shift register;

coupling at least two of the second registers of the input/output cells through the fourth dedicated signal paths so as to form a second serial shift register;

dynamically decoupling the outputs of the registers comprising the first serial shift register and the outputs of the registers comprising the second serial shift register from the programmable interconnect matrix;

in response to a first register control signal from the programmable interconnect matrix, serially shifting the plurality of bits comprising the first data stream within the first serial shift register such that the plurality of bits of the first data stream are transmitted from the programmable interconnect matrix and registered into the first registers of the plurality of input/output cells comprising the first serial shift register, shifting until the the first serial shift register is loaded;

in response to a second register control signal from the programmable interconnect matrix, serially shifting the plurality of bits comprising the second data stream within the second serial shift register such that the plurality of bits of the second data stream are transmitted from the programmable interconnect matrix and registered into the second registers of the plurality of input/output cells comprising the second serial shift register, shifting until the second serial shift register is loaded;

dynamically coupling the outputs of a first predetermined number of registers of the first serial shift register to the programmable interconnect matrix and transmitting the bits of the first serial data stream which were loaded in the first serial shift register into the programmable interconnect matrix in parallel, such that the bits of the first data stream so transmitted comprise the first word of a parallel data stream in the programmable interconnect matrix;

dynamically decoupling the outputs of the first predetermined number of registers of the first serial shift register from the programmable interconnect matrix and dynamically coupling the outputs of a second predetermined number of the registers comprising the second serial shift register to the programmable interconnect matrix; and transmitting the bits of the second data stream which were loaded in the second serial shift register into the programmable interconnect matrix such that the bits of the second data stream so transmitted comprise the second word of the parallel data stream in the programmable interconnect matrix.

25. The method of claim 24 further composing the step of dramatically decoupling the outputs of the predetermined number of registers comprising the second serial shift register from the programmable interconnect matrix.

* * * * *